(12) United States Patent
Jow et al.

(10) Patent No.: US 7,308,377 B2
(45) Date of Patent: Dec. 11, 2007

(54) TEST METHOD OF EMBEDDED CAPACITOR AND TEST SYSTEM THEREOF

(75) Inventors: Uei-Ming Jow, Hsinchu (TW);
Chin-Sun Shyu, Hsinchu (TW);
Chang-Sheng Chen, Hsinchu (TW);
Min-Lin Lee, Hsinchu (TW);
Shinn-Juh Lai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 9 days.

(21) Appl. No.: 11/591,381

(22) Filed: Nov. 1, 2006

(65) Prior Publication Data

US 2007/0168148 A1    Jul. 19, 2007

(30) Foreign Application Priority Data

Jan. 18, 2006    (TW)   ............................... 95101962 A

(51) Int. Cl.
*G01V 1/00* (2006.01)
(52) U.S. Cl. ...................................... 702/117
(58) Field of Classification Search ................. 702/117
See application file for complete search history.

(56) References Cited

U.S. PATENT DOCUMENTS

| | | | |
|---|---|---|---|
| 5,155,655 A | | 10/1992 | Howard et al. |
| 6,068,782 A | * | 5/2000 | Brandt et al. ................. 216/17 |
| 7,019,959 B2 | * | 3/2006 | Chua .......................... 361/329 |
| 2003/0011380 A1 | * | 1/2003 | Harzanu et al. ............ 324/529 |
| 2003/0147194 A1 | * | 8/2003 | Hibi et al. .................. 361/118 |

* cited by examiner

*Primary Examiner*—John Barlow
*Assistant Examiner*—Demetrius Pretlow
(74) *Attorney, Agent, or Firm*—Morris Manning & Martin LLP; Tim Tingkang Xia, Esq.

(57) ABSTRACT

A test method of an embedded capacitor and test system thereof are provided. The method and system are used to determine an electrical specification of the embedded capacitive component in a circuit board substrate, thereby avoiding executing a follow-up fabricating process for the circuit board substrate not satisfying the desired specification. In the method and system, a geometric size of the embedded capacitor is measured, and a relation value between the electrical parameter and the geometric size and a standard electrical parameter are obtained from a model database, to calculate the electrical parameter of the embedded capacitor. Then, the electrical parameter of the embedded capacitor is compared with the standard electrical parameter, to obtain an error value. Therefore, according to the error value, it may be acquired whether or not the circuit board substrate satisfies set electrical specifications.

42 Claims, 16 Drawing Sheets

TEST METHOD OF EMBEDDED CAPACITOR AND TEST SYSTEM THEREOF

CROSS-REFERENCE TO RELATED APPLICATIONS

This non-provisional application claims priority under 35 U.S.C. § 119(a) on Patent Application No(s). 095101962 filed in Taiwan, R.O.C. on Jan. 18, 2006, the entire contents of which are hereby incorporated by reference.

BACKGROUND OF THE INVENTION

1. Field of Invention

The present invention relates to a test method of an embedded capacitor, and more particularly, to a test method of an embedded capacitor and test system thereof, for determining an electrical specification of the embedded capacitive component in a circuit board substrate, thereby avoiding execution of follow-up fabricating processes for circuit board substrate which does not satisfy desired specifications.

2. Related Art

Along with the development trend of electronic products towards high functionality and small size, the lamination technology of the circuit board substrate must be provided with characteristics such as thin thickness, multiple layers, and high density. Therefore, in order to create a bigger space in a limited circuit board substrate area, and enhance the module versatility, a circuit board substrate in which passive components such as resistors, capacitors, and inductors are embedded is developed, thereby creating more space to construct active components, and enhancing the performance of the integral device.

However, the electrical property of the dielectric layer may be unstable because of a variation of the organic material during the process or the material unevenness. In particular, the properties of the embedded components and the high-frequency material must be mastered accurately during the fabrication. Therefore, in an early stage of material development, properties such as the dielectric value of material, the lamination thickness of circuit board substrate, the metal roughness, and even the moso phase change must be measured carefully, to avoid executing a follow-up fabricating process for the circuit board substrate with embedded components not satisfying the desired specification, thereby reducing the electronic product yield, causing a resource waste, and increasing the cost.

As shown in FIG. 1, it shows a conventional circuit board substrate with embedded capacitive components. A conductive metal sheet 12, a dielectric thin plate 14, and a conductive metal sheet 16 are stacked sequentially to form a capacitive circuit board substrate 10, as shown in the U.S. Pat. No. 5,155,655. In a conventional measuring method, the electrical property of each capacitive component can only be obtained through careful measurement one by one. Also, for this circuit board substrate, the capacitive components are embedded, and therefore when measuring, the measured joints of the capacitive components must be connected with the test pad disposed on the surface of the circuit board substrate by a lead, for carrying out the measurement through the test pad. However, this manner is rather complicated and time consuming for a large number of measurements.

It can be known that, at present, there is no efficient measuring method for measuring the embedded components. Conventionally, a test pad must be formed when carrying out electrical measurements and the electrical properties will definitely be damaged. Therefore, when designing an ordinary circuit, the fabrication will need to be performed twice, to slightly adjust the variation in each process.

Therefore, it is a project to be researched by those related in the art that providing a method for determining whether or not the embedded capacitive components, such as capacitors, baluns, and filters, in the entire circuit board substrate satisfy set electrical specifications (not carrying out an open/short test only).

SUMMARY OF THE INVENTION

According to one aspect of the invention, a test method of an embedded capacitor is provided for testing the circuit board substrate with an embedded capacitor. The test method includes the following steps. A geometric size of the embedded capacitor is measured. Then, a relation value between the electrical parameter and the geometric size and a standard electrical parameter are obtained from a model database according to the circuit board substrate. Next, an electrical parameter of the embedded capacitor is calculated with the geometric size and the relation value between the electrical parameter and the geometric size. The electrical parameter is compared with the standard electrical parameter, to obtain an error value. Finally, the error value is determined, thereby acquiring whether or not the circuit board substrate satisfies set electrical specifications.

According to another aspect of the invention, a test system of embedded capacitor is provided. The test system includes an image capturing module, an image analyzing unit, a model database, a searching module, a calculating module, a comparing module, and a determining module. The image capturing module is used to capture an image of the circuit board substrate. The image analyzing unit is used to obtain the geometric size of the embedded capacitor (e.g. the coupling area and/or the thickness of the embedded capacitor) by analyzing the captured image. The searching module is used to obtain a relation value between the electrical parameter and the geometric size and a standard electrical parameter from the model database according to the type of the circuit board substrate. The calculating module is used to calculate an electrical parameter of the embedded capacitor (e.g. a capacitance value of the embedded capacitor) with the obtained geometric size and the obtained relation value. The comparing module is used to compare the electrical parameter with the standard electrical parameter, to obtain an error value. And finally, the determining module is used to determine the error value, thereby generating a determination result indicating whether or not the circuit board substrate satisfies set electrical specifications.

Further scope of applicability of the present invention will become apparent from the detailed description given hereinafter. However, it must be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

The content of the present invention is illustrated in detail by the embodiments with reference to the drawings below. The symbols mentioned in the illustration are the symbols of the reference drawings.

A geometric measurement is adopted to obtain an electrical value of the embedded capacitive component with a geometric size thereof, to determine whether or not the embedded capacitive component satisfies set electrical specifications, thereby avoiding executing follow-up fabricating processes for circuit board substrates which do not satisfy the desired specifications.

Figure 1:
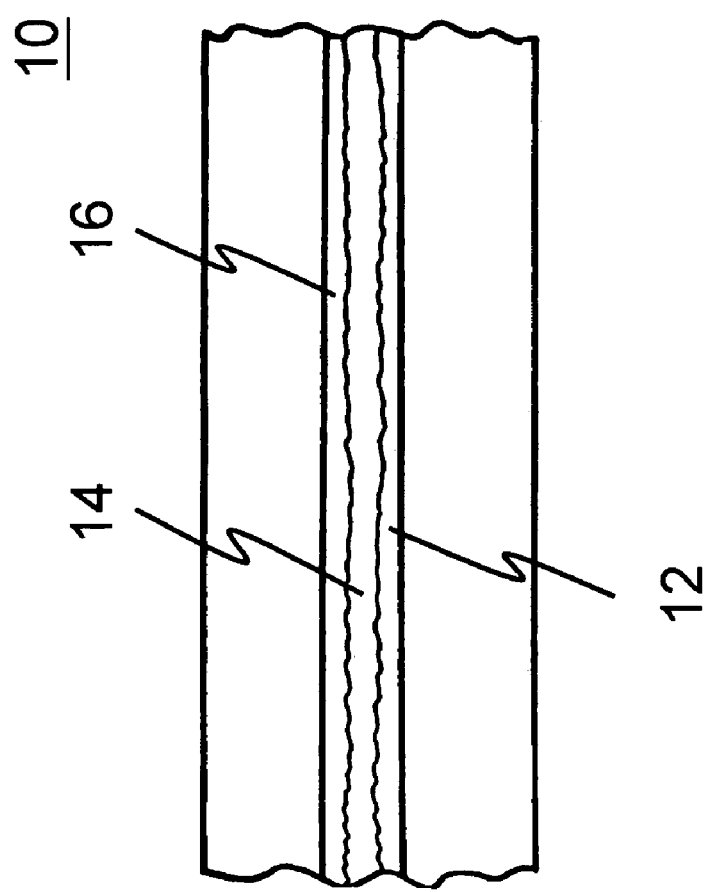
FIG. 1 is a sectional view of a conventional circuit board substrate.
Figure 2:
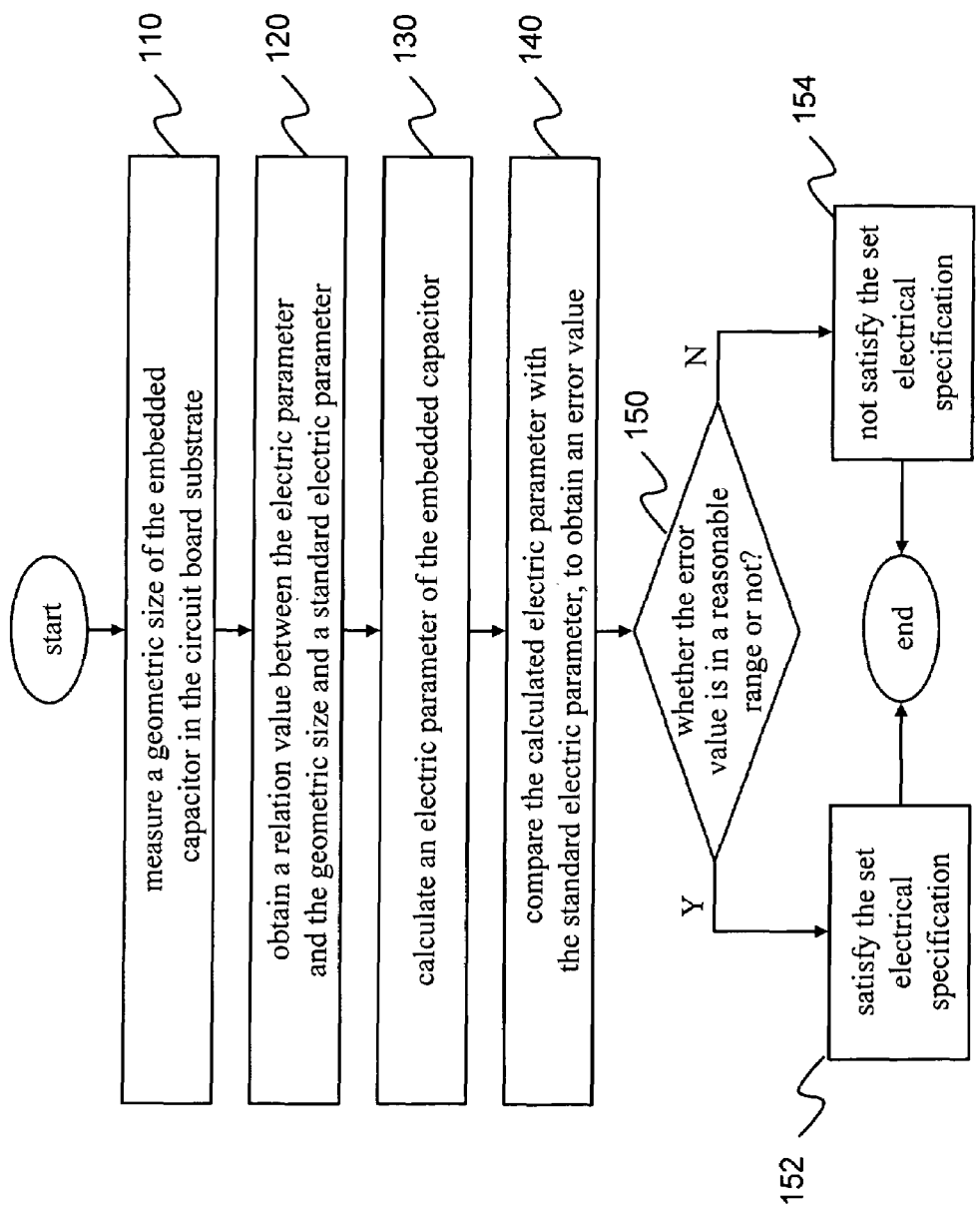
FIG. 2 is a flow chart of a test method of an embedded capacitor according to a first embodiment of the present invention.

As shown in FIG. 2, it is a flow chart of a test method of an embedded capacitor according to one embodiment of the present invention. At first, a geometric size of the embedded capacitor in the circuit board substrate (e.g. a coupling area and a thickness of the embedded capacitor) is measured (Step 110). A relation value between the electrical parameter and the geometric size and a standard electrical parameter are obtained from a model database according to the circuit board substrate (Step 120). An electrical parameter (e.g. a capacitance value) of the embedded capacitor is calculated with the measured geometric size and the obtained relation value (Step 130). The calculated electrical parameter is compared with the standard electrical parameter, to obtain an error value (Step 140). The error value is determined, to acquire whether the error value is in a reasonable range or not (Step 150). When the error value is in the reasonable range, it indicates that the circuit board substrate satisfies set electrical specifications (Step 152). Otherwise when the error value is not in the reasonable range, it indicates that the circuit board substrate does not satisfy set electrical specifications, and must be rejected (Step 154). Therefore, execution of follow-up fabricating processes for circuit board substrates which do not satisfy specifications may be avoided.

Figure 3:
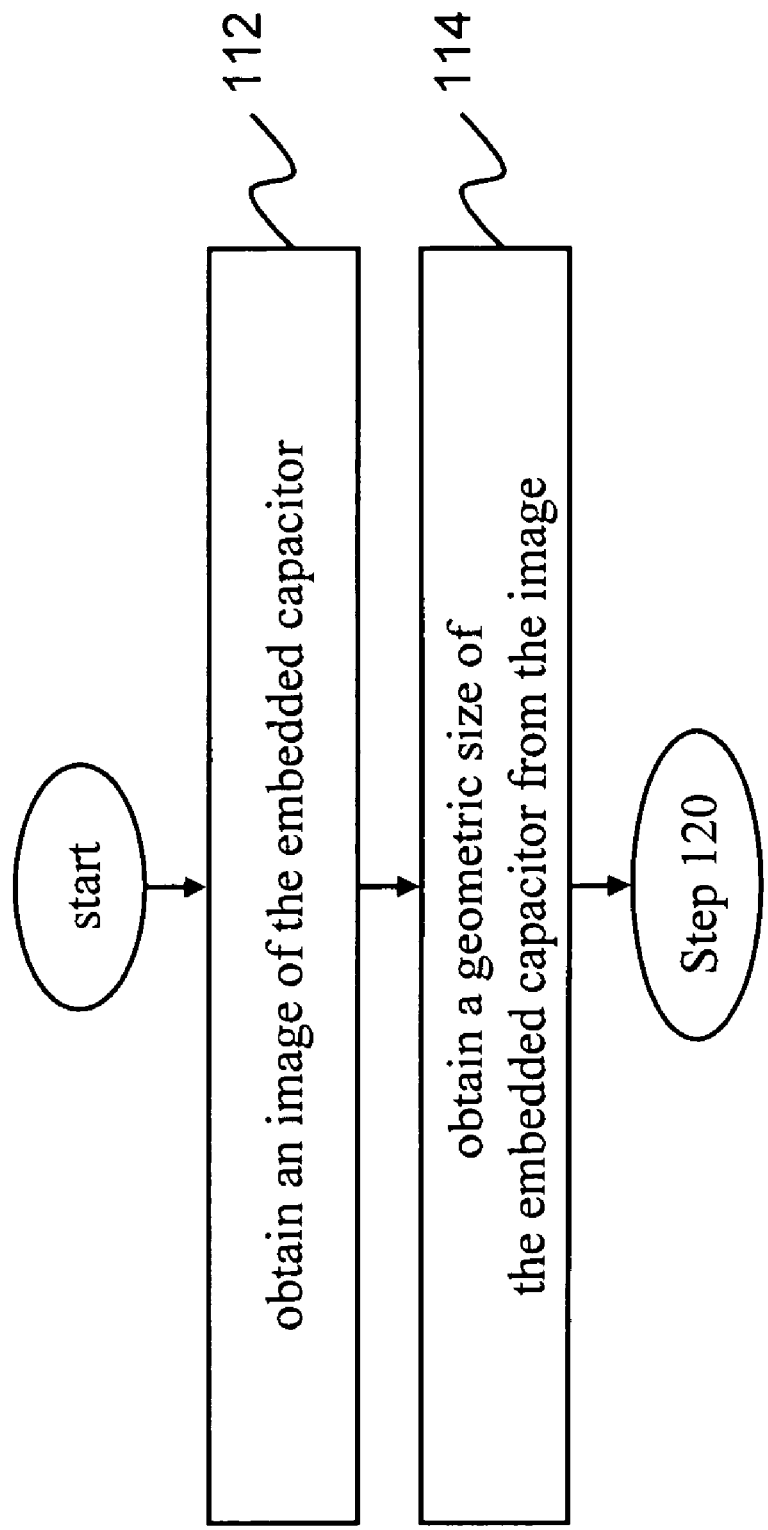
FIG. 3 is a flow chart of an embodiment of Step 110 in FIG. 2.

The measurement of the geometric size of the embedded capacitor can be carried out by a photographic method. In other words, the image of the embedded capacitor can be obtained by a photographic technology (Step 112), and then the geometric size of the embedded capacitor is obtained from the image with an image analyzing technology (Step 114), as shown in FIG. 3.

Figure 4:
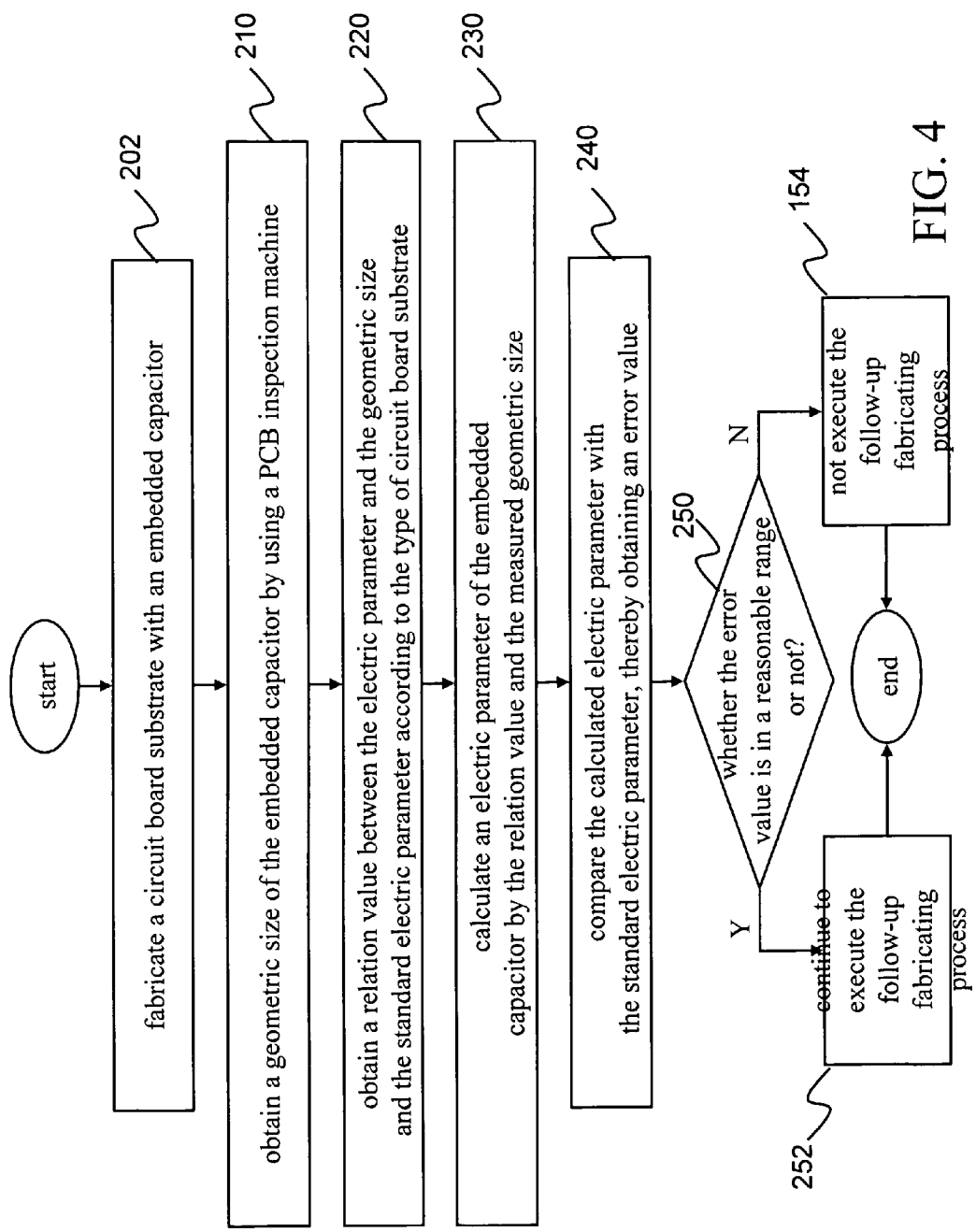
FIG. 4 is a flow chart of the test method of an embedded capacitor according to a second embodiment of the present invention.

For example, when it is applied in an actual mass production, a circuit board substrate with an embedded capacitor is fabricated in advance (Step 202). After the fabrication of the circuit board substrate is completed, a geometric size of the embedded capacitor is obtained with a PCB inspection machine (Step 210). A relation value between the electrical parameter and the geometric size and a standard electrical parameter are obtained from a model database according to the type of the produced circuit board substrate (Step 220). An electrical parameter of the embedded capacitor is calculated by the relation value and the measured geometric size (Step 230). The calculated electrical parameter is compared with the standard electrical parameter, thereby obtaining an error value (Step 240). Then it determines whether the obtained error value is in a reasonable range or not (Step 250). When the error value is in the reasonable range, the circuit board substrate can continue to execute a follow-up fabricating process (Step 252). Otherwise, when the error value is not in the reasonable range, the circuit board substrate does not execute a follow-up fabricating process (Step 254), as shown in FIG. 4.

Figure 5:
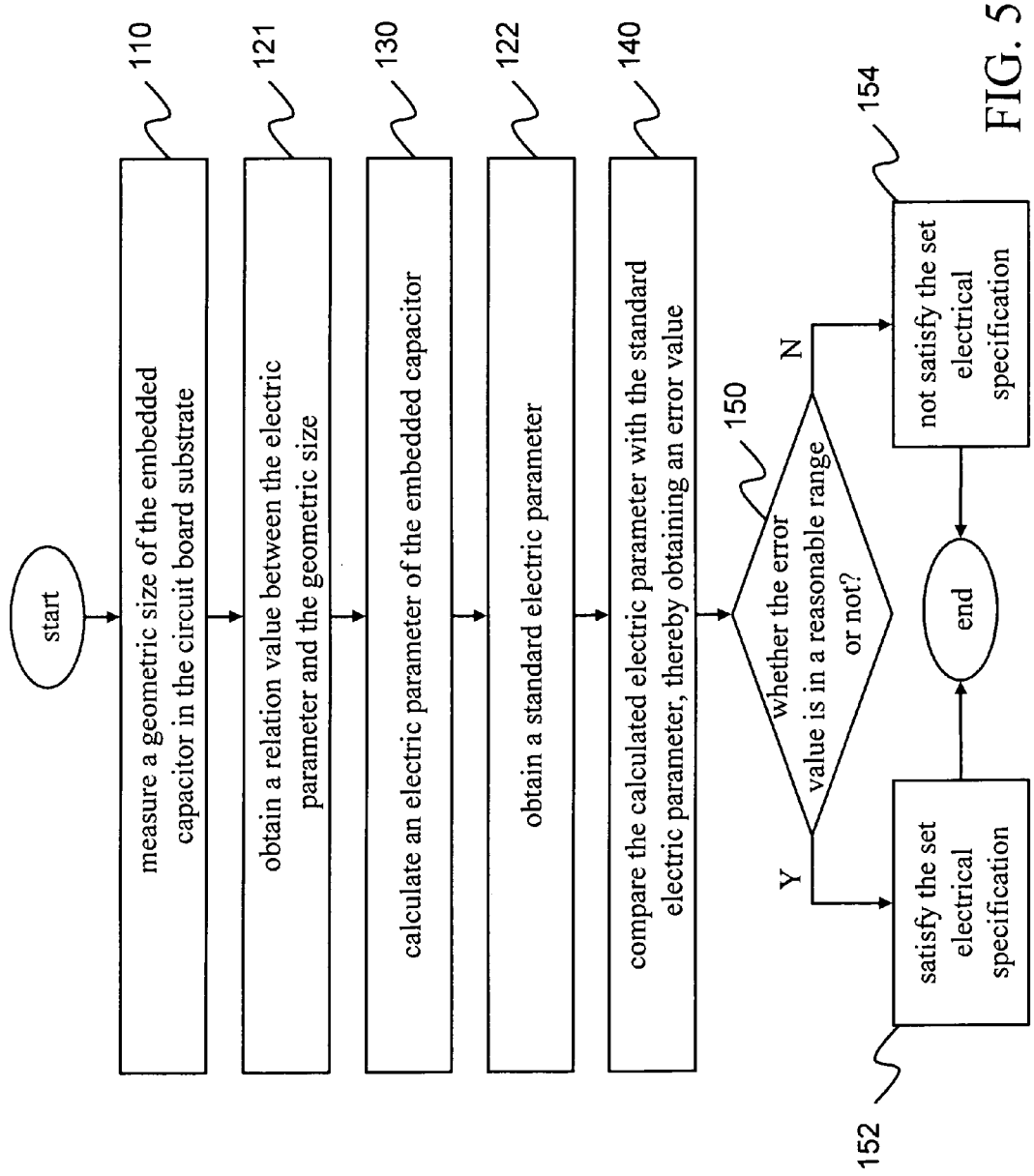
FIG. 5 is a flow chart of the test method of an embedded capacitor according to a third embodiment of the present invention.

In an alternative embodiment, the relation value between the electrical parameter and the geometric size can be obtained in advance (Step 121). After the electrical parameter of the embedded capacitor is calculated (Step 130), the standard electrical parameter can then be obtained (Step 122), to carry out a comparison between the standard electrical parameter and the calculated electrical parameter, thereby obtaining an error value (Step 140), as shown in FIG. 5.

Figure 6A:
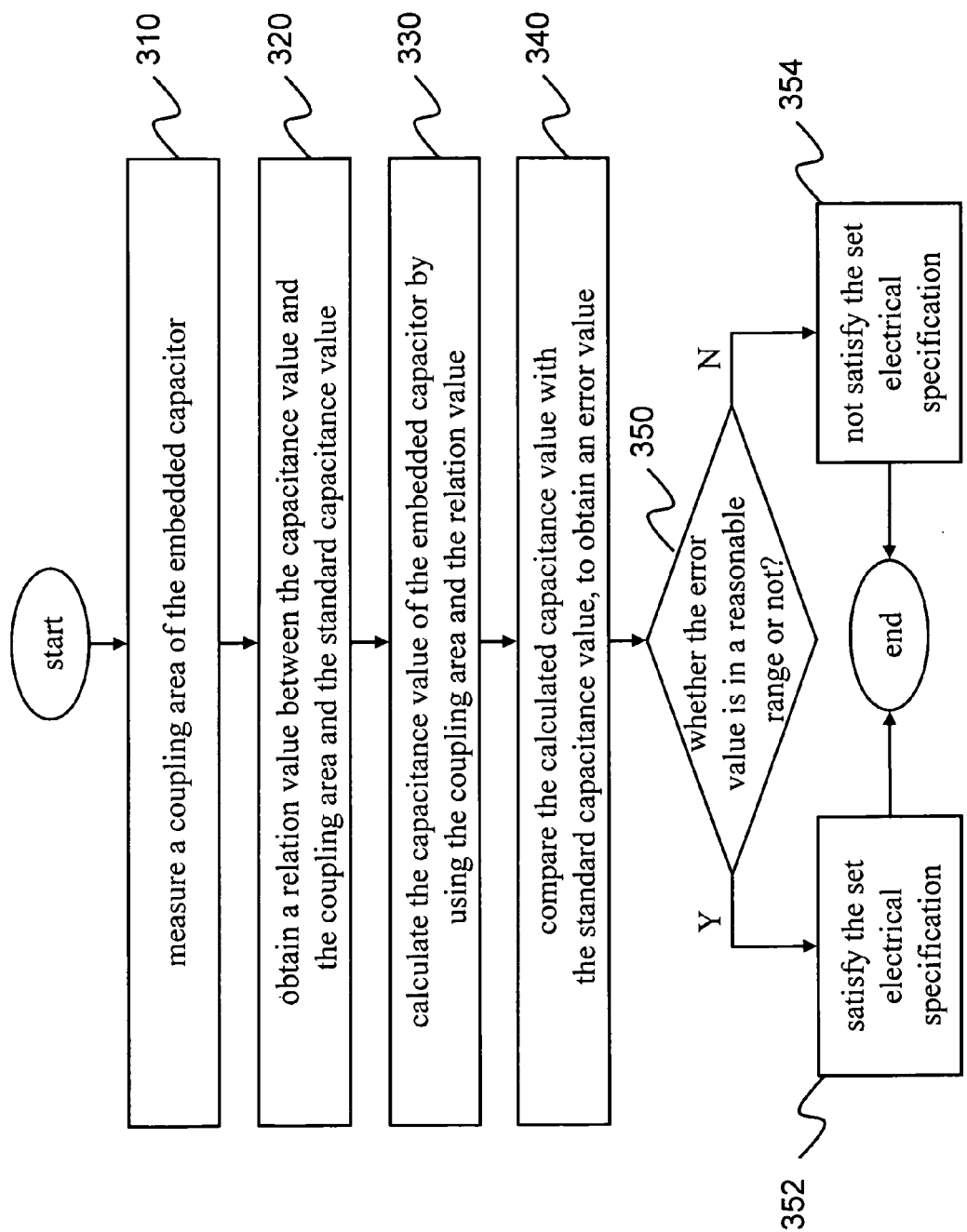
FIG. 6A is a flow chart of the test method of an embedded capacitor according to a fourth embodiment of the present invention.

Moreover, in a yet another embodiment as shown in FIG. 6A, the geometric size of the embedded capacitor can be measured by measuring a coupling area of the embedded capacitor (Step 310). Then, according to the type of the circuit board substrate, a relation value between the capacitance value and the coupling area and a standard capacitance value are obtained from the model database (Step 320). A capacitance value of the embedded capacitor is calculated with the measured coupling area and the obtained relation value (Step 330), and the relational expressions thereof are shown as follows.

$$A = \epsilon 1 \times C \qquad (1)$$

$$A \propto C \qquad (2)$$

In the formulae (1) and (2), the A represents the coupling area of the embedded capacitor, the C represents the capacitance value of the embedded capacitor, and the represents the relation value between the capacitance value and the coupling area.

The calculated capacitance value is compared with the obtained standard capacitance value, to obtain an error value between the two (Step 340). Herein, the thickness and the dielectric constant of the embedded capacitor are single variables (i.e. the $\epsilon 1$), and are assumed to be fixed values, to calculate the capacitance value by the actual upper and lower coupling areas (including a process etching error and an alignment error).

Finally, it is judged whether the error value is in a reasonable range or not (Step 350), to acquire whether or not the circuit board substrate satisfies set electrical specifications.

Figure 6B:
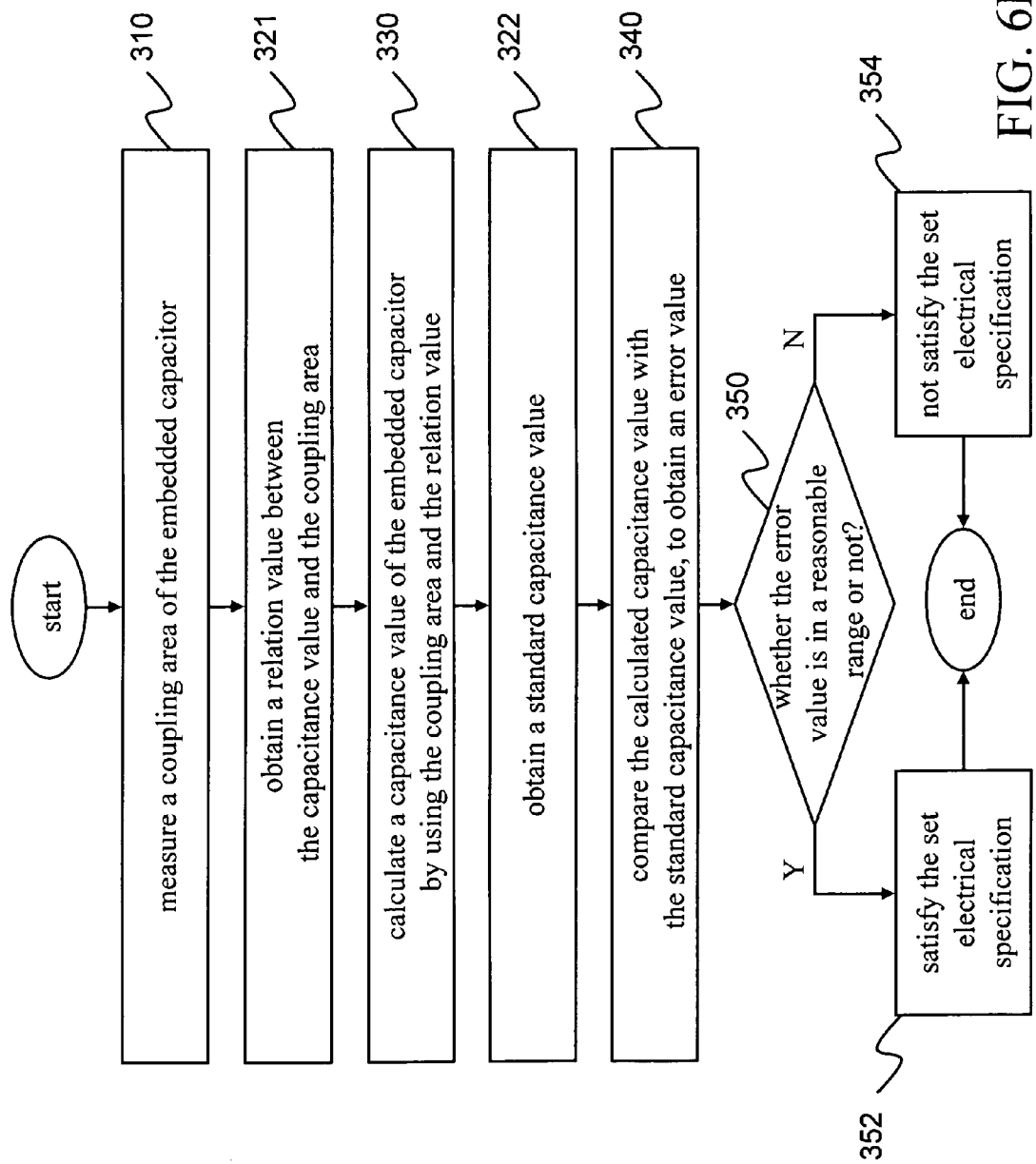
FIG. 6B is a flow chart of the test method of an embedded capacitor according to a fifth embodiment of the present invention.

In yet another embodiment, the relation value between the capacitance value and the coupling area can be obtained in advance (Step 321), and the standard capacitance value can then be obtained (Step 322), after calculating the capacitance value of the embedded capacitor (Step 330), as shown in FIG. 6B.

Figure 7A:
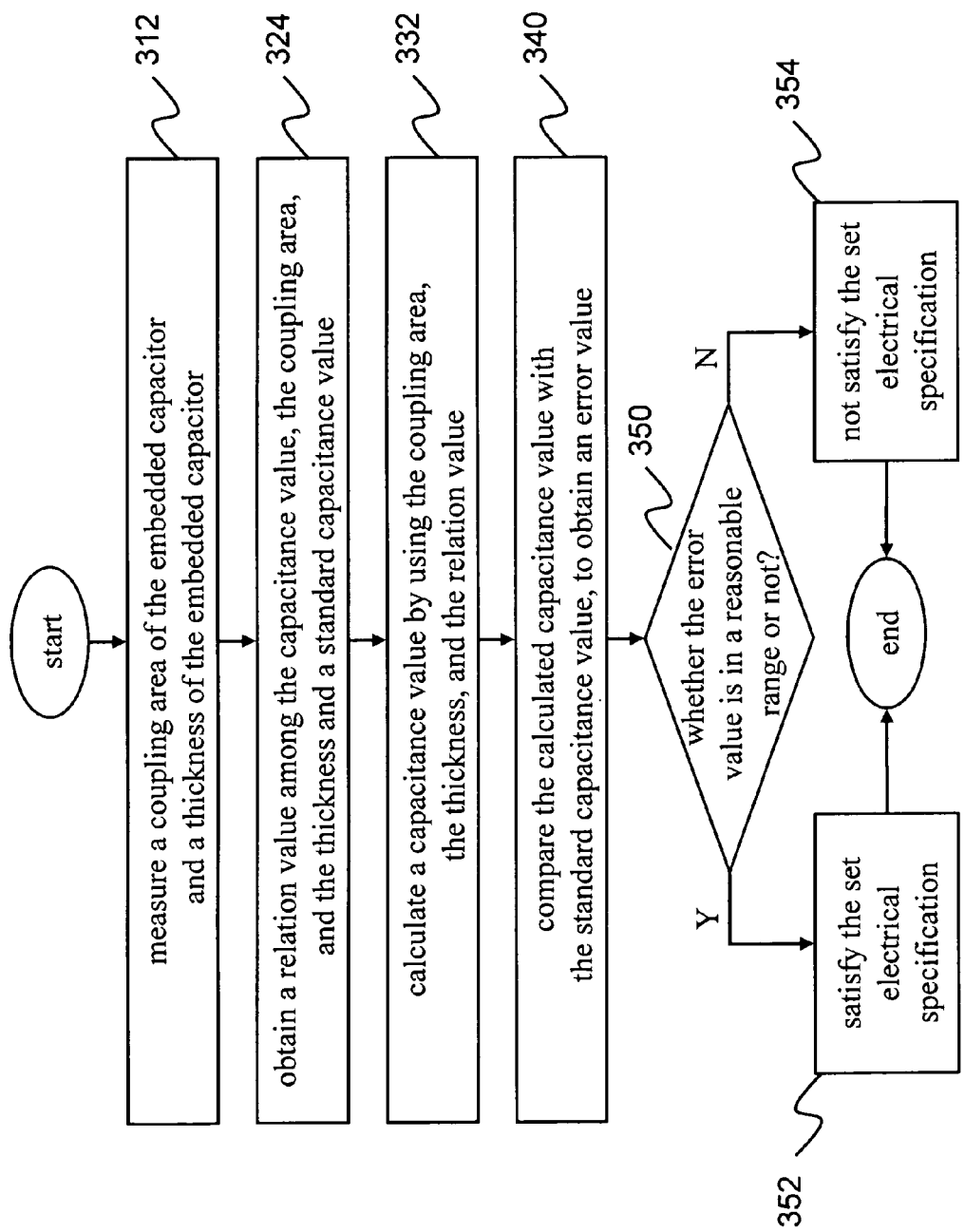
FIG. 7A is a flow chart of the test method of an embedded capacitor according to a sixth embodiment of the present invention.

In yet another embodiment, as shown in FIG. 7A, the geometric size of the embedded capacitor also can be measured by measuring a coupling area of the embedded capacitor and a thickness of the embedded capacitor (Step 312). Then, a relation value among the capacitance value, the coupling area, and the thickness and a standard capacitance value are obtained from the model database according to the type of the circuit board substrate (Step 324). A capacitance value of the embedded capacitor is calculated with the measured coupling area and thickness, and the obtained relation value (Step 332), and the relational expressions thereof are shown as follows.

$$A = \epsilon 2 \times \frac{C}{d} \qquad (3)$$

$$A \propto \frac{C}{d} \qquad (4)$$

In formulae (3) and (4), the A represents the coupling area of the embedded capacitor, the C represents the capacitance value of the embedded capacitor, the d represents the thickness of the embedded capacitor, and the $\epsilon 2$ represents the relation value among the capacitance value, the coupling area, and the thickness. In other words, the coupling area of the embedded capacitor is proportional to the capacitance value of the embedded capacitor divided by the thickness.

The calculated capacitance value is compared with the obtained standard capacitance value, to obtain an error value between the two (Step 340). Herein, the dielectric constant (i.e. the $\epsilon 2$) is assumed to be a fixed value, and the capacitance value is calculated by the actual upper and lower coupling areas (including a process etching error and an alignment error) and the compressed thickness.

Finally, it is judged whether or not the error value is in a reasonable range (Step 350), to acquire whether or not the circuit board substrate satisfies set electrical specifications.

Figure 7B:
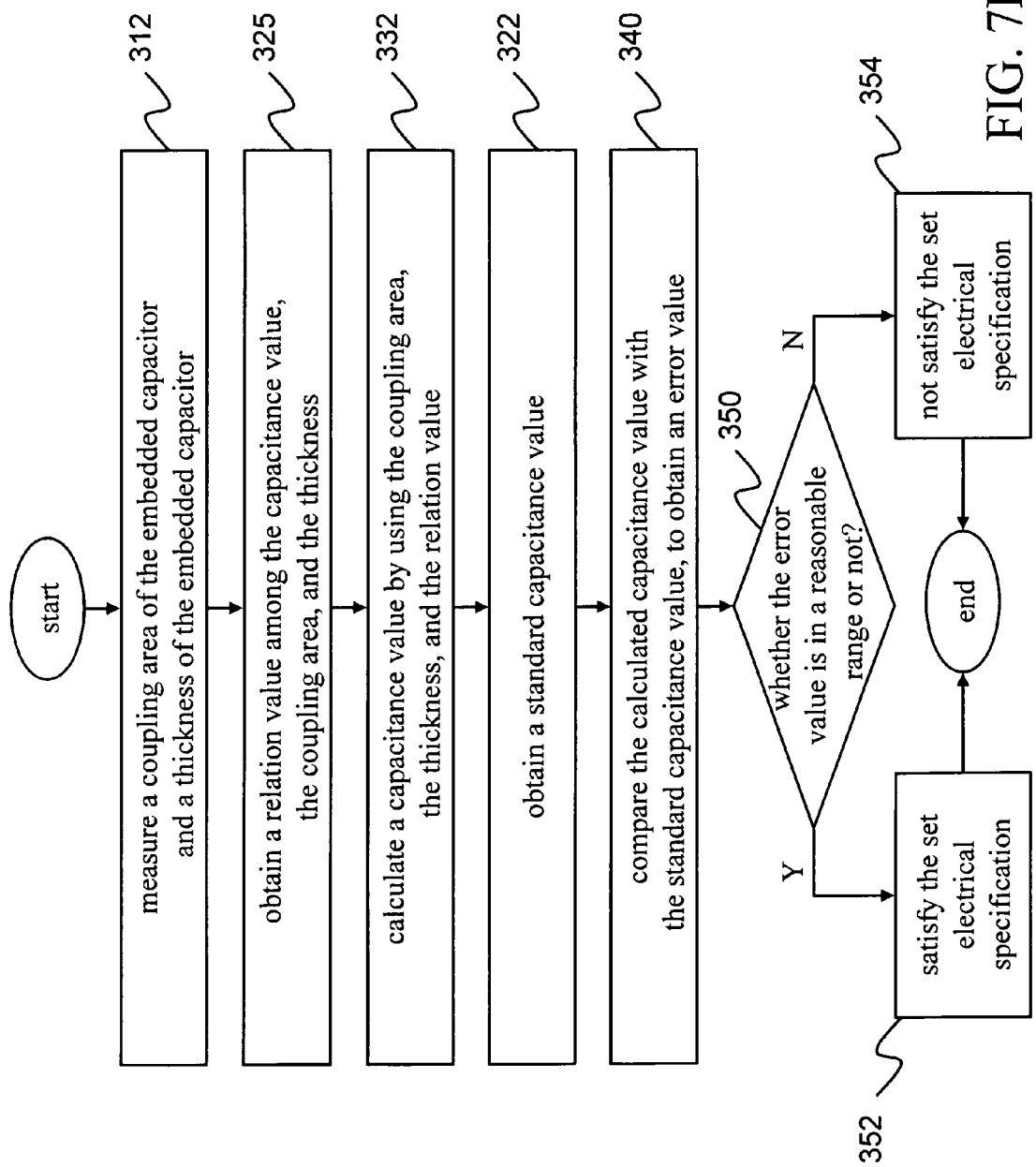
FIG. 7B is a flow chart of the test method of an embedded capacitor according to a seventh embodiment of the present invention.

In still another embodiment, the relation value among the capacitance value, the coupling area, and the thickness can be obtained in advance (Step 325), and the standard capacitance value can then be obtained (Step 322), after calculating the capacitance value of the embedded capacitor (Step 330), as shown in FIG. 7B.

Figure 8:
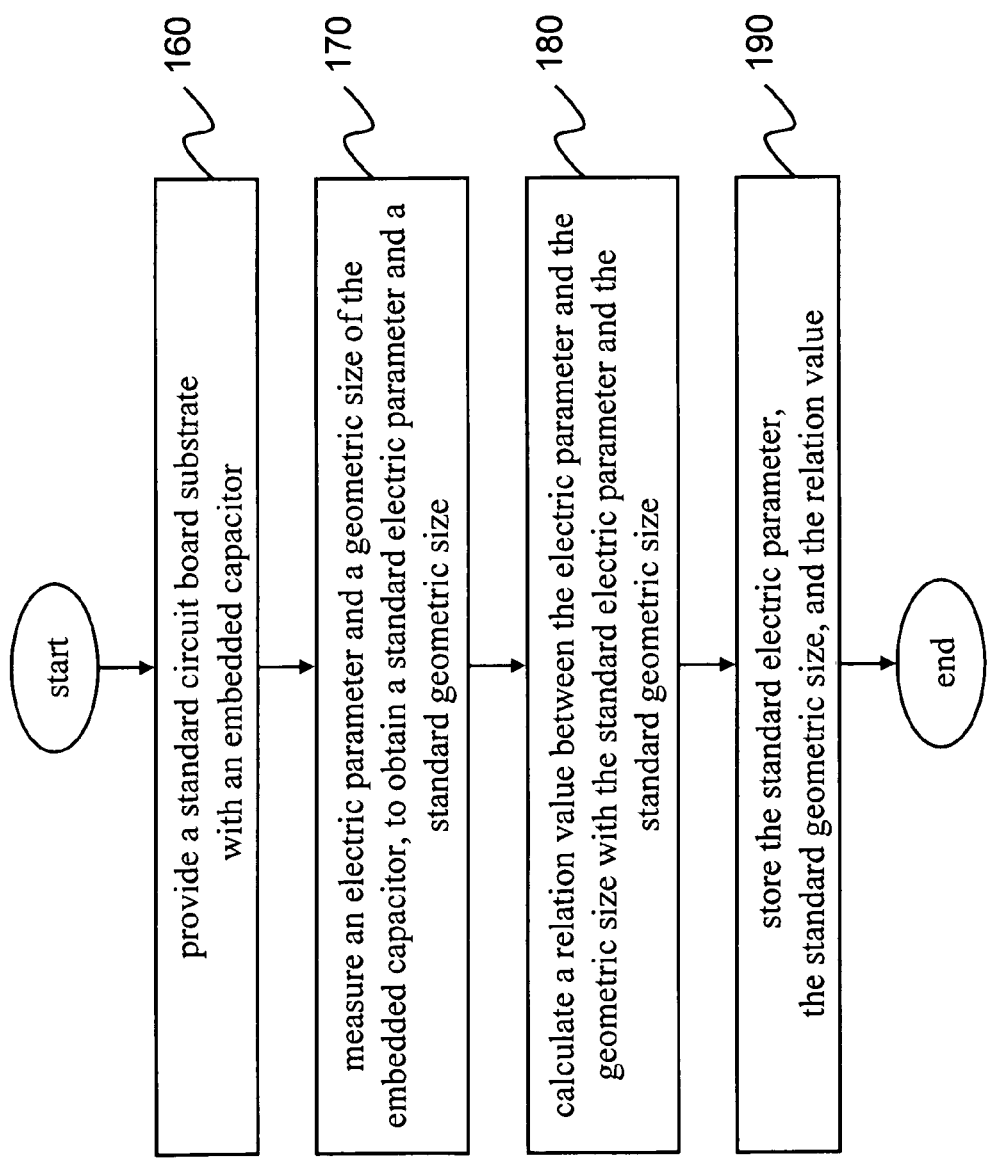
FIG. 8 is a flow chart of establishing a model database in the test method of an embedded capacitor according to a first embodiment of the present invention.

Each item of information in the model database can be established by measuring a standard circuit board substrate in advance. As shown in FIG. 8, a standard circuit board substrate with an embedded capacitor is fabricated by a standard process in advance (Step 160). An electrical parameter (e.g. a capacitance value) and a geometric size (e.g. a coupling area and a thickness of the embedded capacitor) of the embedded capacitor are measured, to obtain a standard electrical parameter and a standard geometric size (Step 170). A relation value between the electrical parameter and the geometric size is calculated with the obtained standard electrical parameter and the standard geometric size (Step 180), and the standard electrical parameter, the standard geometric size, and the relation value are stored (Step 190), thereby establishing a model database.

Figure 9:
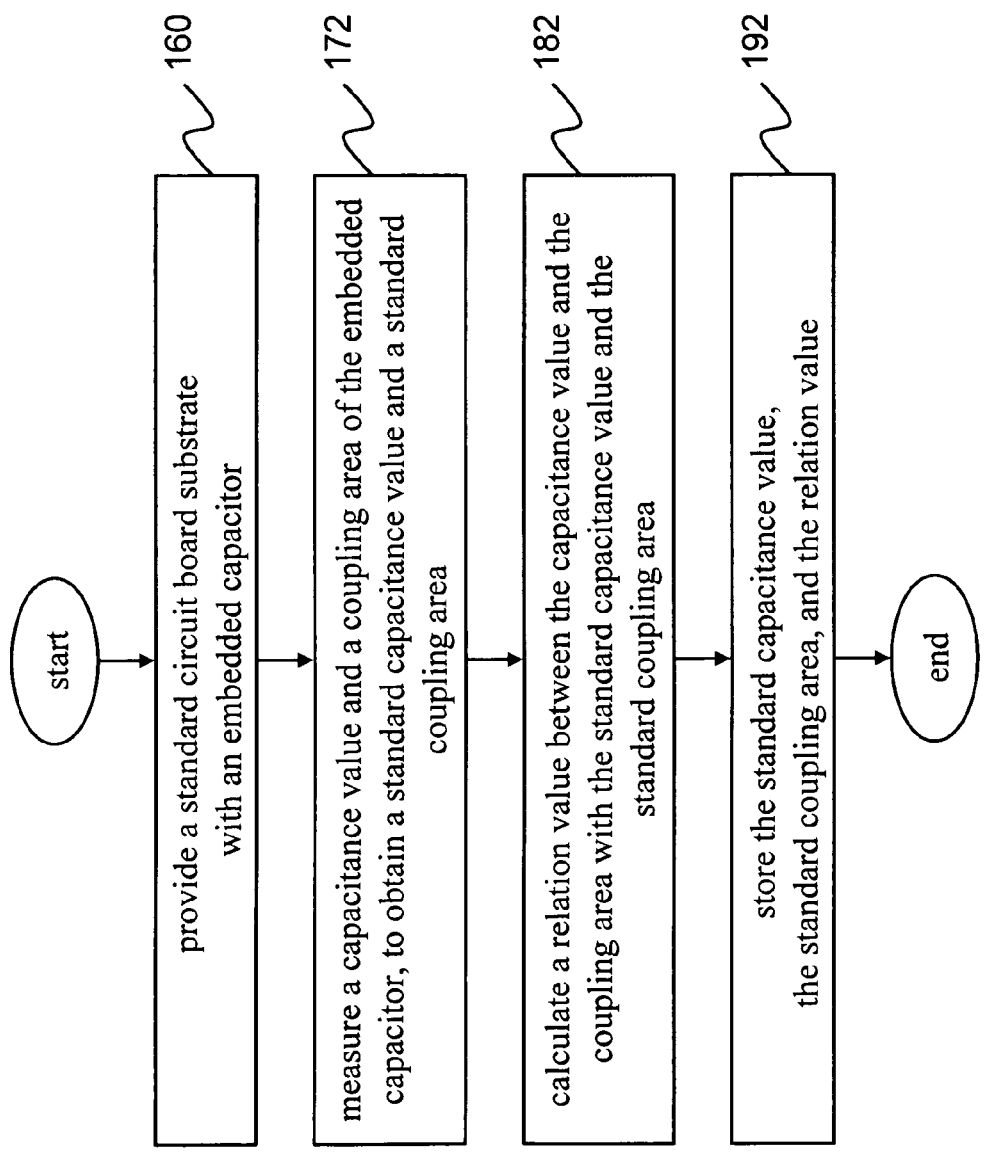
FIG. 9 is a flow chart of establishing the model database in the test method of an embedded capacitor according to a second embodiment of the present invention.

As shown in FIG. 9, in Step 170, the capacitance value and the coupling area of the embedded capacitor can be measured, to obtain a standard capacitance value and a standard coupling area (Step 172), thereby calculating the relation value between the capacitance value and the area (Step 182), and the relational expressions thereof are shown as follows.

$$A' = \epsilon 1 \times C \qquad (5)$$

$$A' \propto C' \qquad (6)$$

In formulae (5) and (6), the A' represents the standard coupling area of the embedded capacitor, the C' represents the standard capacitance value of the embedded capacitor, and the $\epsilon 1$ represents the relation value between the capacitance value and the coupling area.

Finally, the obtained standard capacitance value, standard coupling area, and relation value are stored (Step 192), to establish a model database.

Figure 10:
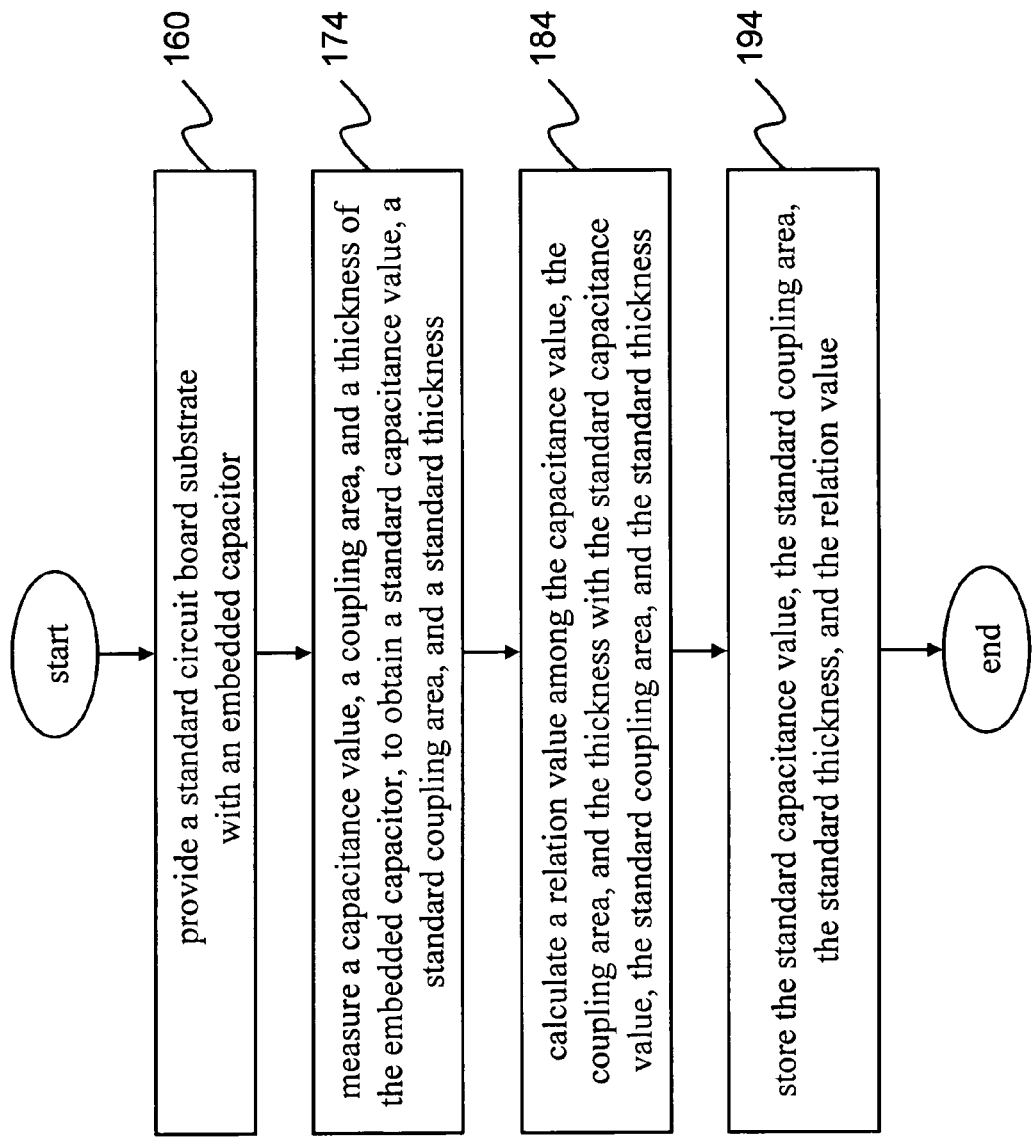
FIG. 10 is a flow chart of establishing the model database in the test method of an embedded capacitor according to a third embodiment of the present invention.

Furthermore, as shown in FIG. 10, in Step 170, the capacitance value, the coupling area, and the thickness of the embedded capacitor can be measured, to obtain the standard capacitance value, the standard coupling area, and the standard thickness (Step 174), thereby calculating the relation value among the capacitance value, the coupling area, and the thickness (Step 184), and the relational expressions are shown as follows.

$$A' = \epsilon 2 \times \frac{C'}{d'} \qquad (7)$$

$$A \propto \frac{C}{d} \qquad (8)$$

In formulae (7) and (8), the A' represents the standard coupling area of the embedded capacitor, the C' represents the standard capacitance value of the embedded capacitor, the d' represents the standard thickness of the embedded capacitor, and the 2 represents the relation value among the capacitance value, the coupling area, and the thickness.

Finally, the obtained standard capacitance value, standard coupling area, standard thickness, and relation value are stored (Step 194), to establish a model database.

Figure 11A:
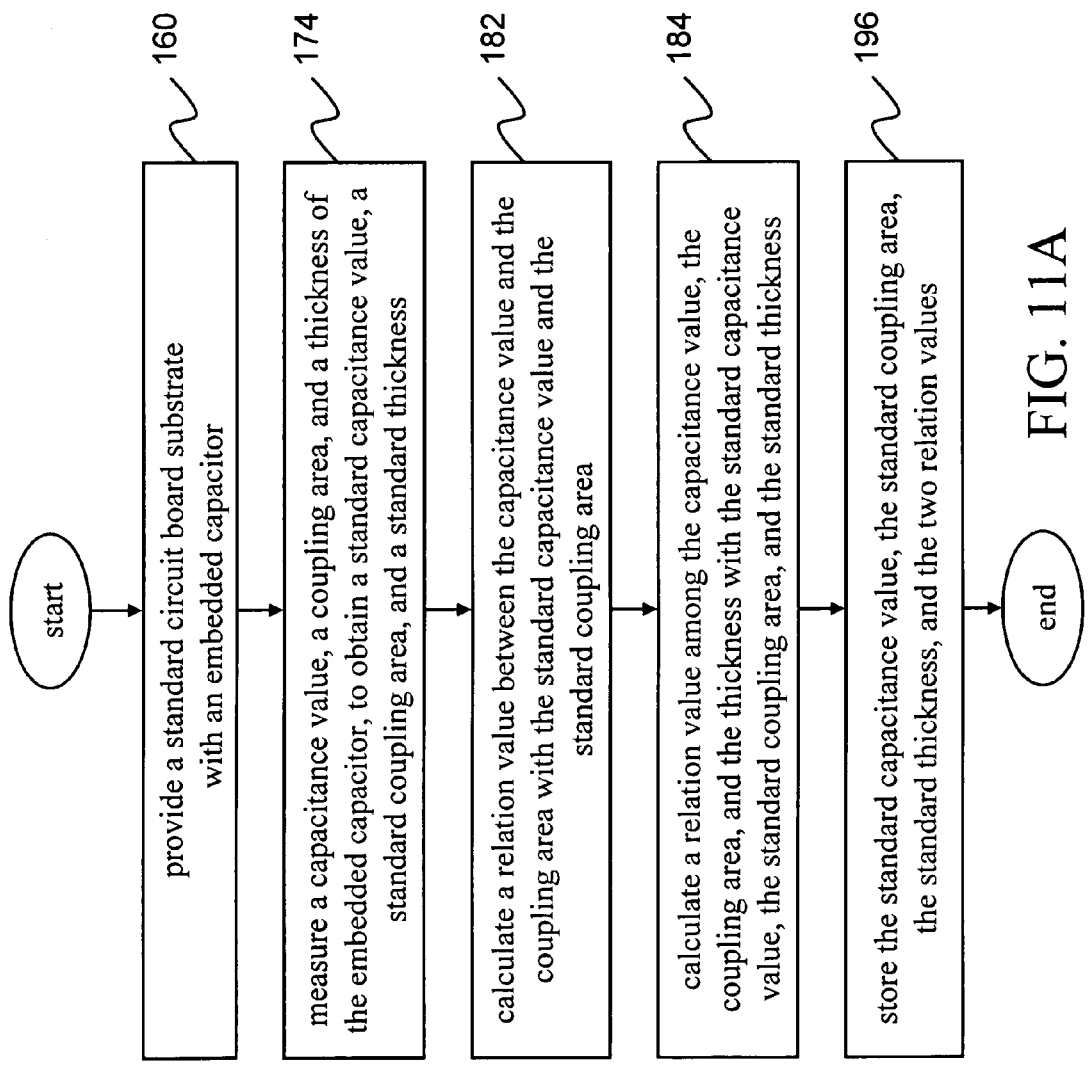
FIG. 11A is a flow chart of establishing the model database in the test method of an embedded capacitor according to a fourth embodiment of the present invention.
Figure 11B:
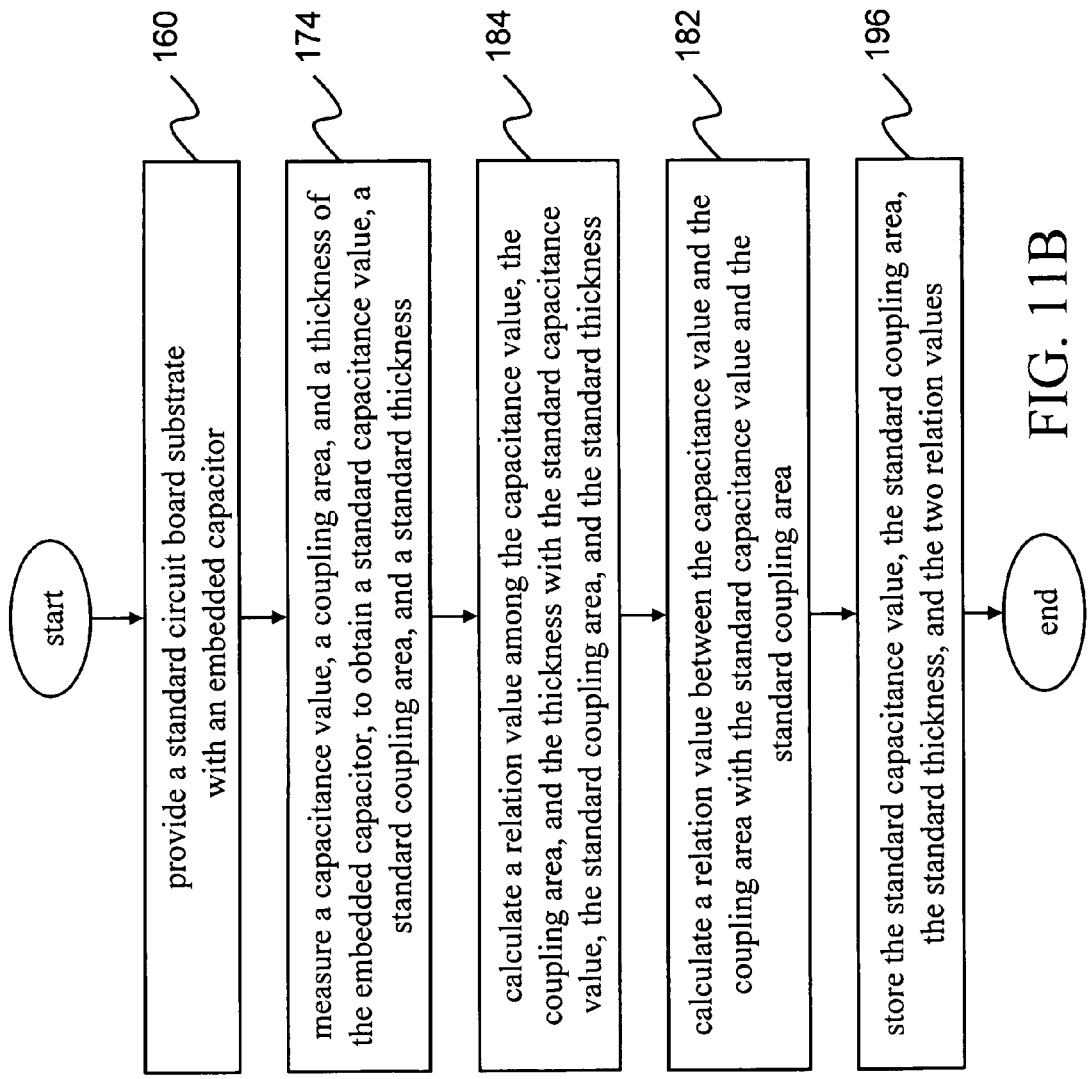
FIG. 11B is a flow chart of establishing the model database in the test method of an embedded capacitor according to a fifth embodiment of the present invention.

However, the above two relation values can be calculated respectively (Steps 182, 184). Finally, the obtained standard capacitance value, standard coupling area, standard thickness, and two relation values are stored (Step 196), to establish the two relation values in the model database in advance, thereby establishing the model database, as shown in FIGS. 11A and 11B.

Various parameters, including a standard electrical parameter, a standard geometric size, and a relation value between each electrical parameter and geometric size, of various standard circuit board substrate can be established in the model database in the above manner in advance. The standard circuit board substrate can be classified according to information such as the process flow, the material of each layer, and/or the entire structure size.

Figure 12:
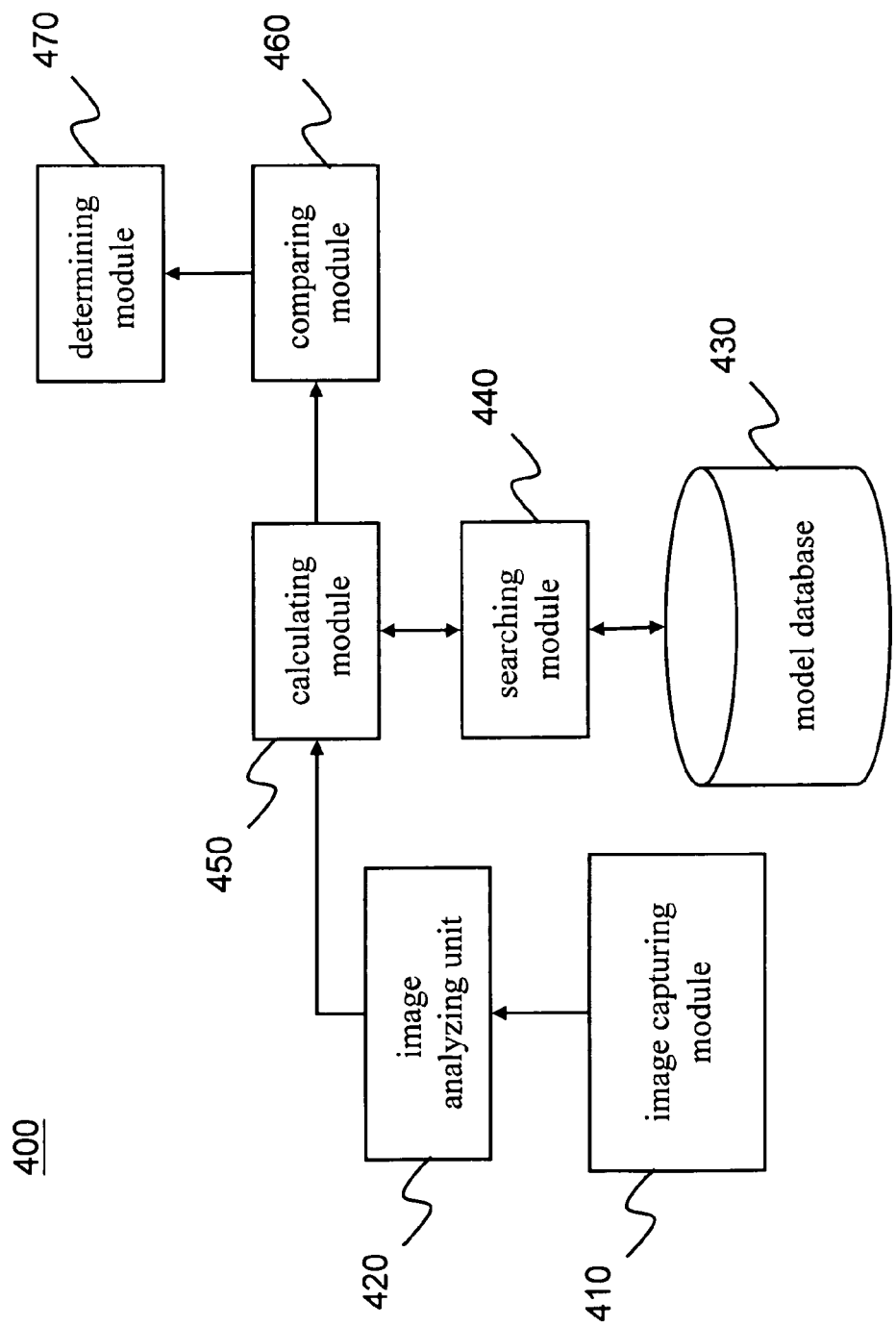
FIG. 12 is a general structural view of a test system of embedded capacitor according to a first embodiment of the present invention.

As shown in FIG. 12, it is a test system of embedded capacitor according to an embodiment of the present invention. The test system 400 includes an image capturing module 410, an image analyzing unit 420, a model database 430, a searching module 440, a calculating module 450, a comparing module 460, and a determining module 470.

The test system of embedded capacitor 400 can be combined with the process system to carry out a test after the circuit board substrate with an embedded capacitor is fabricated. At first, the image capturing module 410 is used to capture an image of the circuit board substrate, and then the image analyzing unit 420 connected to the image capturing module 410 is used to analyze the captured image, to obtain a geometric size of the embedded capacitor (e.g. a coupling area and/or a thickness of the embedded capacitor). The searching module 440 connected to the model database 430 is used to obtain a relation value between the electrical parameter and the geometric size and a standard electrical parameter from the model database 430 according to the type of the circuit board substrate. Then, the calculating module 450 is used to calculate an electrical parameter of the embedded capacitor (e.g. a capacitance value of the embedded capacitor) with the obtained geometric size and the obtained relation value. The comparing module 460 is used to compare the electrical parameter with the standard electrical parameter, thereby obtaining an error value. The error value is determined with the determining module 470, thereby generating a determination result indicating whether or not the circuit board substrate satisfies set electrical specifications.

The geometric size of the embedded capacitor analyzed by the image analyzing unit 420 can be a coupling area of the embedded capacitor, and/or a thickness of the embedded capacitor. The relation value between the electrical parameter and the geometric size obtained by the searching module 440 can be a relation value between the capacitance value and the coupling area, and/or the relation value among the capacitance value, the coupling area, and the thickness. The obtained standard electrical parameter can be the standard capacitance value. Also, the electrical parameter calculated by the calculating module 450 can be a capacitance value.

For example, when the image analyzing unit 420 obtains a coupling area of the embedded capacitor by analyzing, the searching module 440 obtains a relation value between the capacitance value and the coupling area and a standard capacitance value from the model database 430. The calculating module 450 calculates a capacitance value of the embedded capacitor according to the formula $A = \epsilon 1 \times C$, wherein the A represents the coupling area of the embedded capacitor, the C represents the capacitance value of the embedded capacitor, and the $\epsilon 1$ represents the relation value between the capacitance value and the coupling area. Furthermore, when the image analyzing unit 420 obtains the coupling area and the thickness of the embedded capacitor by analyzing, the searching module 440 obtains a relation value among the capacitance value, the coupling area, and the thickness and a standard capacitance value from the model database 430. Then, the calculating module 450 calculates a capacitance value of the embedded capacitor according to the formula $$A = \varepsilon 2 \times \frac{C}{d},$$

wherein the A represents the coupling area of the embedded capacitor, the C represents the capacitance value of the embedded capacitor, the d represents the thickness of the embedded capacitor, and the $\epsilon 2$ represents the relation value among the capacitance value, the coupling area, and the thickness.

Moreover, the determining module 470 judges the error value according to a reasonable range. When the error value is in the reasonable range, the generated determination result indicates that the circuit board substrate satisfies set electrical specifications. Otherwise, when the error value is not in the reasonable range, the generated determination result indicates that the circuit board substrate does not satisfy set electrical specifications.

Figure 13:
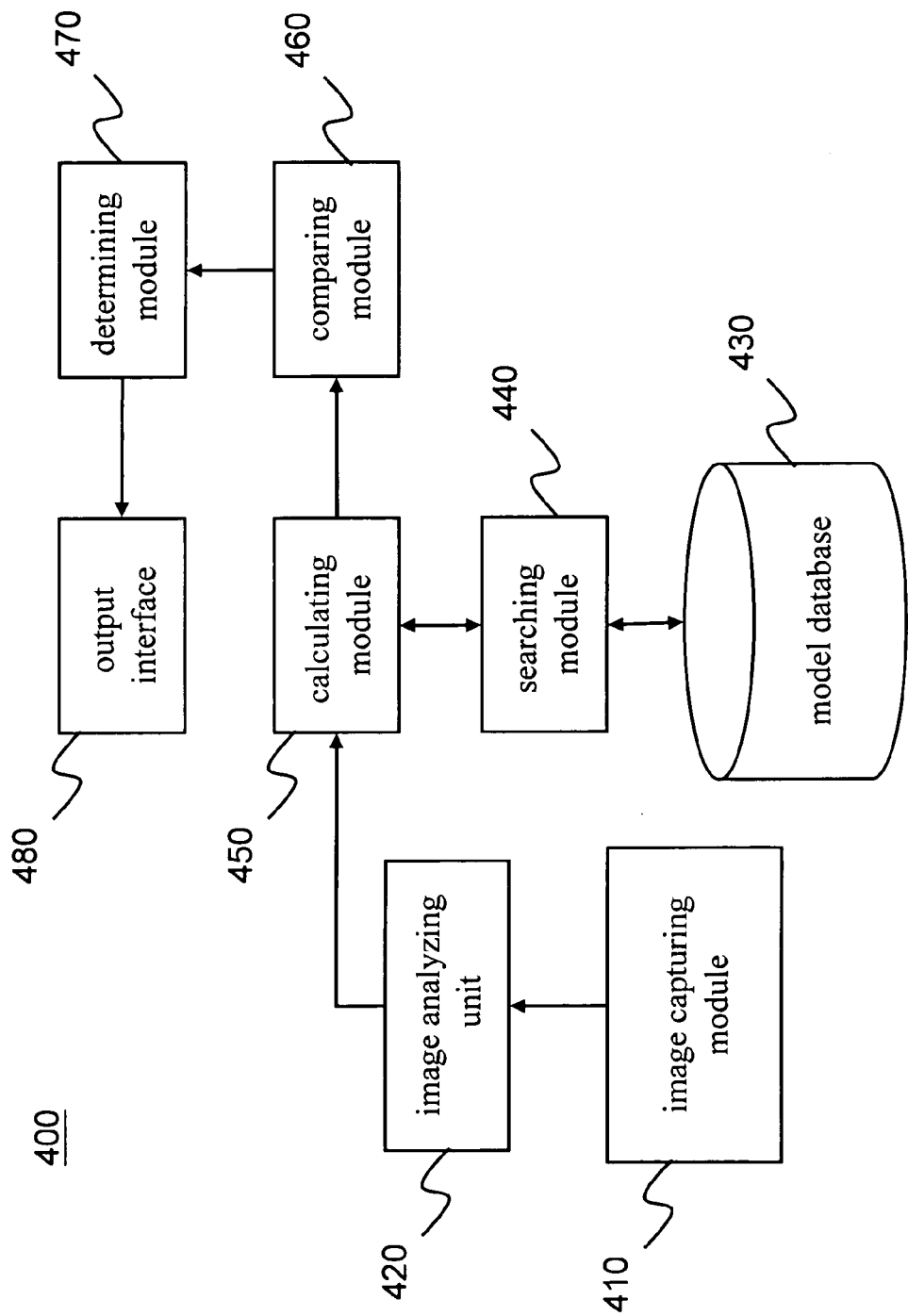
FIG. 13 is a general structural view of the test system of embedded capacitor according to a second embodiment of the present invention.

Furthermore, the determination result can be output through an output interface 480, thereby avoiding executing the follow-up fabricating process for the circuit board substrate not satisfying the desired specification, and avoiding a resource waste, as shown in FIG. 13. The output interface 480 can be a display module for displaying the determination result, or a transmission interface for outputting the determination result to a follow-up process system.

The image capturing module and the image analyzing unit can be achieved by a PCB inspection machine. The searching module, the calculating module, the comparing module, and the determining module can be achieved by one or more data processing units. The data processing unit can be a central processing unit.

Furthermore, the model database contains various parameters, including a standard electrical parameter, a standard geometric size, and a relation value between each electrical parameter and geometric size, of various standard circuit board substrates established in advance. The circuit board substrate can be classified according to information such as the process flow, the material used in each layer, and/or the entire structure size.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A test method of an embedded capacitor for testing a circuit board substrate having an embedded capacitor, comprising:

measuring a geometric size of the embedded capacitor;
obtaining a relation value between an electrical parameter and the geometric size from a model database according to the circuit board substrate;
obtaining a standard electrical parameter from the model database according to the circuit board substrate;
calculating an electrical parameter of the embedded capacitor with the relation value and the geometric size;
comparing the electrical parameter of the embedded capacitor with the standard electrical parameter, thereby obtaining an error value; and
determining the error value, thereby acquiring whether or not the circuit board substrate satisfies set electrical specifications.

2. The test method of an embedded capacitor as claimed in claim 1, wherein the step of measuring a geometric size of the embedded capacitor comprises:
measuring a coupling area of the embedded capacitor.

3. The test method of an embedded capacitor as claimed in claim 2, wherein the step of obtaining a value between electrical parameter and the geometric size from a model database according to the substrate structure comprises:
obtaining a relation value between a capacitance value and the coupling area from the model database according to the circuit board substrate.

4. The test method of an embedded capacitor as claimed in claim 3, wherein the step of calculating an electrical parameter of the embedded capacitor with the relation value and the geometric size comprises:
calculating a capacitance value of the embedded capacitor with the obtained relation value between the capacitance value and the coupling area and the measured coupling area.

5. The test method of an embedded capacitor as claimed in claim 4, wherein in the step of calculating a capacitance value of the embedded capacitor with the obtained relation value between the capacitance value and the coupling area and the measured coupling area, the calculation is carried out according to a formula $A = \epsilon 1 \times C$, wherein the A represents the coupling area of the embedded capacitor, the C represents the capacitance value of the embedded capacitor, and the $\epsilon 1$ represents the relation value between the capacitance value and the coupling area.

6. The test method of an embedded capacitor as claimed in claim 1, wherein the step of measuring a geometric size of the embedded capacitor comprises:
measuring a coupling area and a thickness of the embedded capacitor.

7. The test method of an embedded capacitor as claimed in claim 1, wherein the step of obtaining a relation value between an electrical parameter and the geometric size from a model database according to the circuit board substrate comprises:
obtaining a relation value among the capacitance value, the coupling area, and the thickness from the model database according to the circuit board substrate.

8. The test method of an embedded capacitor as claimed in claim 7, wherein the step of calculating an electrical parameter of the embedded capacitor with the relation value between the electrical parameter and the geometric size and the geometric size comprises:
calculating a capacitance value of the embedded capacitor with the measured coupling area and thickness, and the obtained relation value among the capacitance value, the coupling area, and the thickness.

9. The test method of an embedded capacitor as claimed in claim 8, wherein in the step of calculating a capacitance value of the embedded capacitor with the measured coupling area and thickness, and the obtained relation value among the capacitance value, the coupling area, and the thickness, the calculation is carried out according to a formula $$A = \epsilon 2 \times \frac{C}{d},$$

wherein the A represents the coupling area of the embedded capacitor, the C represents the capacitance value of the embedded capacitor, the d represents the thickness of the embedded capacitor, and the $\epsilon 2$ represents the relation value among the capacitance value, the coupling area, and the thickness.

10. The test method of an embedded capacitor as claimed in claim 1, wherein the step of obtaining a standard electrical parameter from the model database according to the circuit board substrate comprises:
obtaining a standard capacitance value from the model database according to the circuit board substrate.

11. The test method of an embedded capacitor as claimed in claim 10, wherein the step of comparing the electrical parameter with the standard electrical parameter thereby obtaining an error value comprises:
comparing a calculated capacitance value with the obtained standard capacitance value, thereby obtaining the error value.

12. The test method of an embedded capacitor as claimed in claim 1, wherein the step of determining the error value thereby acquiring whether or not the circuit board substrate satisfies set electrical specifications comprises:
judging the error value according to a reasonable range;
indicating that the circuit board substrate satisfies set electrical specifications when the error value falls in the reasonable range; and
indicating that the circuit board substrate does not satisfy set electrical specifications when the error value is not in the reasonable range.

13. The test method of an embedded capacitor as claimed in claim 1, wherein the step of measuring a geometric size of the embedded capacitor comprises:
obtaining an image of the embedded capacitor with a photographic technology; and
obtaining the geometric size of the embedded capacitor from the image with an image analyzing technology.

14. The test method of an embedded capacitor as claimed in claim 1, wherein the step of measuring a geometric size of the embedded capacitor comprises:
measuring the geometric size of the embedded capacitor by a printed circuit board (PCB) inspection machine.

15. The test method of an embedded capacitor as claimed in claim 1, further comprising:
establishing the model database.

16. The test method of an embedded capacitor as claimed in claim 15, wherein the step of establishing the model database comprises:
providing a standard circuit board substrate, wherein each circuit board substrate has an embedded capacitor with a geometric size;
measuring an electrical parameter and the geometric size of the embedded capacitor, thereby obtaining at least one standard electrical parameter and a standard geometric size;
calculating the relation value with the standard electrical parameter and the standard geometric size; and storing the standard electrical parameter, the standard geometric size, and the relation value between the electrical parameter and the geometric size.

17. The test method of an embedded capacitor as claimed in claim 16, wherein the step of providing at least one standard circuit board substrate comprises fabricating the standard circuit board substrate with a standard process.

18. The test method of an embedded capacitor as claimed in claim 16, wherein the step of measuring an electrical parameter and the geometric size of the embedded capacitor thereby obtaining a standard electrical parameter and a standard geometric size comprises:
measuring a capacitance value and a coupling area of the embedded capacitor, thereby obtaining a standard capacitance value and a standard coupling area.

19. The test method of an embedded capacitor as claimed in claim 18, wherein the step of calculating the relation value between the electrical parameter and the geometric size with the standard electrical parameter and the standard geometric size comprises:
calculating a relation value between the capacitance value and the coupling area with the standard capacitance value and the standard coupling area.

20. The test method of an embedded capacitor as claimed in claim 19, wherein the step of storing the standard electrical parameter, the standard geometric size, and the relation value between the electrical parameter and the geometric size comprises:
storing the standard capacitance value, the standard coupling area, and the relation value between the capacitance value and the coupling area.

21. The test method of an embedded capacitor as claimed in claim 19, wherein in the step of calculating a relation value between the capacitance value and the coupling area with the standard capacitance value and the standard coupling area, the calculation is carried out according to a formula A'=$\epsilon$1×C', wherein the A' represents the standard coupling area of the embedded capacitor, the C' represents the standard capacitance value of the embedded capacitor, and the $\epsilon$1 represents the relation value between the capacitance value and the coupling area.

22. The test method of an embedded capacitor as claimed in claim 16, wherein the step of measuring an electrical parameter and the geometric size of the embedded capacitor thereby obtaining a standard electrical parameter and a standard geometric size comprises:
measuring the capacitance value, the coupling area, and the thickness of the embedded capacitor, to obtain a standard capacitance value, a standard coupling area, and a standard thickness.

23. The test method of an embedded capacitor as claimed in claim 22, wherein the step of calculating the relation value between the electrical parameter and the geometric size with the standard electrical parameter and the standard geometric size comprises:
calculating a relation value among the capacitance value, the coupling area, and the thickness with the standard capacitance value, the standard coupling area, and the standard thickness.

24. The test method of an embedded capacitor as claimed in claim 23, wherein the step of storing the standard electrical parameter, the standard geometric size, and the relation value between the electrical parameter and the geometric size comprises:
storing the standard capacitance value, the standard coupling area, and the standard thickness and the relation value among the capacitance value, the coupling area, and the thickness.

25. The test method of an embedded capacitor as claimed in claim 23, wherein in the step of calculating a relation value among the capacitance value, the coupling area, and the thickness with the standard capacitance value, the standard coupling area, and the standard thickness, the calculation is carried out according to a formula $$A' = \varepsilon 2 \times \frac{C'}{d'},$$

wherein the A' represents the standard coupling area of the embedded capacitor, the C' represents the standard capacitance value of the embedded capacitor, the d' represents the standard thickness of the embedded capacitor, and the $\epsilon$2 represents the relation value among the capacitance value, the coupling area, and the thickness.

26. The test method of an embedded capacitor as claimed in claim 22, wherein the step of calculating the relation value between the electrical parameter and the geometric size with the standard electrical parameter and the standard geometric size comprises:
calculating a relation value between the capacitance value and the coupling area, and a relation value among the capacitance value, the coupling area, and the thickness with the standard capacitance value, the standard coupling area, and the standard thickness.

27. The test method of an embedded capacitor as claimed in claim 26, wherein the step of storing the standard electrical parameter, the standard geometric size, and the relation value between the electrical parameter and the geometric size comprises:
storing the standard capacitance value, the standard coupling area, the standard thickness, the relation value between the capacitance value and the coupling area, and the relation value among the capacitance value, the coupling area, and the thickness.

28. The test method of an embedded capacitor as claimed in claim 26, wherein in the step of calculating a relation value between the capacitance value and the coupling area and a relation value among the capacitance value, the coupling area, and the thickness with the standard capacitance value, the standard coupling area, and the standard thickness, the calculation is carried out according to a formula A'=$\epsilon$1×C' and a formula $$A' = \varepsilon 2 \times \frac{C'}{d'},$$

wherein the A' represents the standard coupling area of the embedded capacitor, the C' represents the standard capacitance value of the embedded capacitor, the d' represents the standard thickness of the embedded capacitor, the $\epsilon$1 represents the relation value between the capacitance value and the coupling area, and the $\epsilon$2 represents the relation value among the capacitance value, the coupling area, and the thickness.

29. The test method of an embedded capacitor as claimed in claim 1, wherein in the step of obtaining a relation value between an electrical parameter and the geometric size from a model database according to the circuit board substrate and the step of obtaining a standard electrical parameter from the model database according to the circuit board substrate, according to the circuit board substrate refers to according to a type of the circuit board substrate.

30. The test method of an embedded capacitor as claimed in claim 29, wherein the type of the circuit board substrate is classified according to at least one of the process flow of the circuit board substrate, the material of the circuit board substrate, and the entire structure size of the circuit board substrate.

31. A test system of embedded capacitor for testing a circuit board substrate having an embedded capacitor, comprising:
   a model database, for storing a standard electrical parameter and a relation value between an electrical parameter and an geometric size according to the type of a circuit board substrate;
   an image capturing module, for capturing an image of the circuit board substrate;
   an image analyzing unit, for analyzing the image to acquire a geometric size of the embedded capacitor;
   a searching module, for obtaining a relation value between an electrical parameter and the geometric size and the standard electrical parameter from the model database according to the type of the circuit board substrate being tested;
   a calculating module, for calculating an electrical parameter of the embedded capacitor with the geometric size and the relation value;
   a comparing module, for comparing the electrical parameter with the standard electrical parameter, thereby obtaining an error value; and
   a determining module, for determining the error value to generate a determination result indicating whether or not the circuit board substrate satisfies set electrical specifications.

32. The test system of embedded capacitor as claimed in claim 31, wherein the geometric size is at least one of a coupling area and a thickness.

33. The test system of embedded capacitor as claimed in claim 31, wherein the electrical parameter is a capacitance value.

34. The test system of embedded capacitor as claimed in claim 31, wherein the relation value between the electrical parameter and the geometric size is one of a relation value between the capacitance value and the coupling area, and a relation value among the capacitance value, the coupling area, and the thickness.

35. The test system of embedded capacitor as claimed in claim 31, wherein the standard electrical parameter is a standard capacitance value.

36. The test system of embedded capacitor as claimed in claim 31, wherein when the geometric size is a coupling area, the electrical parameter is a capacitance value, and the relation value between the electrical parameter and the geometric size is a relation value between the capacitance value and the coupling area, the calculating module calculates the capacitance value of the embedded capacitor according to a formula $A = \epsilon 1 \times C$, wherein the A represents the coupling area of the embedded capacitor, the C represents the capacitance value of the embedded capacitor, and the $\epsilon 1$ represents the relation value between the capacitance value and the coupling area.

37. The test system of embedded capacitor as claimed in claim 31, wherein when the geometric size comprises a coupling area and a thickness, the electrical parameter is a capacitance value, and the relation value between the electrical parameter and the geometric size is a relation value among the capacitance value, the coupling area, and the thickness, the calculating module calculates the capacitance value of the embedded capacitor according to a formula $$A = \epsilon 2 \times \frac{C}{d},$$

wherein the A represents the coupling area of the embedded capacitor, the C represents the capacitance value of the embedded capacitor, the d represents the thickness of the embedded capacitor, and the $\epsilon 2$ represents the relation value among the capacitance value, the coupling area, and the thickness.

38. The test system of embedded capacitor as claimed in claim 31, further comprising:
   an output interface, for outputting the determination result.

39. The test system of embedded capacitor as claimed in claim 31, wherein the image capturing module and the image analyzing unit are achieved by a PCB inspection machine.

40. The test system of embedded capacitor as claimed in claim 31, wherein the searching module, the calculating module, the comparing module, and the determining module are achieved by at least one data processing unit.

41. The test system of embedded capacitor as claimed in claim 31, wherein the determining module judges the error value according to a reasonable range, when the error value falls in the reasonable range, the generated determination result indicates that the circuit board substrate satisfies set electrical specifications, and when the error value is not in the reasonable range, the generated determination result indicates that the circuit board substrate does not satisfy set electrical specifications.

42. The test system of embedded capacitor as claimed in claim 31, wherein the circuit board substrate is classified according to at least one of the process flow of the circuit board substrate, the material of the circuit board substrate, and the entire structure size of the circuit board substrate.

* * * * *